United States Patent
Sugai et al.

(10) Patent No.: US 10,461,104 B2
(45) Date of Patent: Oct. 29, 2019

(54) FRICTION MATERIAL

(71) Applicant: AKEBONO BRAKE INDUSTRY CO., LTD., Chuo-ku, Tokyo (JP)

(72) Inventors: Yoshiyuki Sugai, Tokyo (JP); Katsuji Seki, Tokyo (JP)

(73) Assignee: AKEBONO BRAKE INDUSTRY CO., LTD., Chuo-ky, Tokyo (JP)

(*) Notice: Subject to any disclaimer, the term of this patent is extended or adjusted under 35 U.S.C. 154(b) by 12 days.

(21) Appl. No.: 14/646,419

(22) PCT Filed: Dec. 20, 2013

(86) PCT No.: PCT/JP2013/084238
§ 371 (c)(1),
(2) Date: May 21, 2015

(87) PCT Pub. No.: WO2014/098213
PCT Pub. Date: Jun. 26, 2014

(65) Prior Publication Data
US 2015/0287753 A1    Oct. 8, 2015

(30) Foreign Application Priority Data
Dec. 21, 2012  (JP) .................................. 2012-280239

(51) Int. Cl.
 H01L 27/144  (2006.01)
 F16D 69/02  (2006.01)
 H01L 31/02  (2006.01)

(52) U.S. Cl.
CPC ........ *H01L 27/1446* (2013.01); *F16D 69/026* (2013.01); *H01L 31/02005* (2013.01); *F16D 2200/0086* (2013.01)

(58) Field of Classification Search
CPC ... H01L 27/1446; H01L 27/144; H01L 31/02; F16D 69/026
USPC .......................................... 523/149; 257/448
See application file for complete search history.

(56) References Cited

U.S. PATENT DOCUMENTS

| | | | |
|---|---|---|---|
| 5,383,963 A | 1/1995 | Kobayashi et al. | |
| 6,335,096 B1 | 1/2002 | Konnai | |
| 6,413,622 B1* | 7/2002 | Kobayashi | B29C 43/006 106/36 |
| 8,241,595 B2 | 8/2012 | Itoi | |
| 2002/0157321 A1* | 10/2002 | Chiba | F16D 69/026 51/307 |
| 2004/0030000 A1* | 2/2004 | Takeuchi | F16D 69/026 523/155 |
| 2007/0148428 A1 | 6/2007 | Suzuki et al. | |
| 2008/0249222 A1* | 10/2008 | Itoi | C01G 23/005 524/413 |
| 2011/0158898 A1 | 6/2011 | Itoi | |
| 2011/0259686 A1 | 10/2011 | Hattori et al. | |
| 2013/0096228 A1 | 4/2013 | Yamamoto et al. | |
| 2013/0240310 A1 | 9/2013 | Baba et al. | |
| 2014/0342899 A1 | 11/2014 | Itami et al. | |

FOREIGN PATENT DOCUMENTS

| | | |
|---|---|---|
| CN | 1016317477 A | 1/2010 |
| CN | 102713334 A | 10/2012 |
| JP | H06-220426 A | 8/1994 |
| JP | H06-248091 A | 9/1994 |
| JP | 2000-219872 A | 8/2000 |
| JP | 2000-256013 A | 9/2000 |
| JP | 2005-247898 A | 9/2005 |
| JP | 2006-206900 A | 8/2006 |
| JP | 2007-218395 A | 8/2007 |
| JP | 2010-077341 A | 4/2010 |
| JP | 2010-285558 A | 12/2010 |
| JP | 2011-256255 A | 12/2011 |
| JP | 5071604 B2 | 11/2012 |
| WO | WO-2008/123046 A1 | 10/2008 |
| WO | WO-2011/158917 A1 | 12/2011 |
| WO | WO 2012/169545 A1 | 12/2012 |
| WO | WO 2012/169546 A1 | 12/2012 |
| WO | WO-2013/039183 A1 | 3/2013 |

OTHER PUBLICATIONS

Extended European Search Report dated Nov. 9, 2016 in corresponding European patent application 1386668.7 (11 pages).
CN Office Action dated Aug. 8, 2016 from corresponding Chinese patent application No. 201380062609.5 (with attached English-language translation).
Materia Japan vol. 44, No. 10, Jun. 28, 2005, 9 pages, (with attached Partial English-language translation, 2 pages).
MILEX—Handbook of Phenolic Resins for Brake Binders, Mistui Chemicals America Inc. Brochure, 2003, with a partial English Translation.
Opposition to Grant of Patent dispatched Mar. 1, 2017 in Japanese Opposition No. 2017-700112 of Japanese Patent No. 5981839 (13 pages) with an English Translation (32 pages).
The Third Office Action dated Feb. 23, 2017 in Chinese Patent Application No. 201380062609.5 (4 pages) with an English Translation (5 pages).

(Continued)

*Primary Examiner* — Doris L Lee
(74) *Attorney, Agent, or Firm* — Drinker Biddle & Reath LLP

(57) ABSTRACT

A subject for the invention is to provide a friction material which contains neither any copper component nor metallic fibers and which has stable frictional properties and excellent wear resistance and is less apt to attack mating materials. This invention relates to a friction 10-35% by volume potassium titanate having a plurality of protrudent shapes, 3-10% by volume abrasive material having a Moh's hardness of 7 or higher, and 10-30% by volume elastomer-modified phenolic resin.

5 Claims, No Drawings

(56) References Cited

OTHER PUBLICATIONS

Decision on Rejection dated Sep. 22, 2017 in Chinese Patent Application No. 201380062609 (3 pages) with an English translation (5 pages).
Communication pursuant to Article 94(3) EPC dated Dec. 20, 2018 in European Patent Application No. 13 866 368.7.

* cited by examiner

FRICTION MATERIAL

TECHNICAL FIELD

The present invention relates to a friction material. More particularly, the invention relates to a friction material for use in brake pads or brake linings, clutches, etc. for motor vehicles, railroad cars, industrial machines, and the like.

BACKGROUND ART

The friction material for use in brakes, such as disk brakes and drum brakes, or in clutches or the like is formed from starting materials such as a fibrous base material having a reinforcing function, a friction modifier which has a frictional function and serves to regulate the frictional performance of the fibrous base material, and a binder which integrates these ingredients together.

With the recent trend toward increases in performance and speed in vehicles, the role of brakes is becoming severer increasingly, and the brakes must have a sufficiently high friction coefficient (effectiveness). Furthermore, upon braking at high speeds, the friction material heats up to a high temperature and hence comes into a frictional state different from that in braking at low temperatures and low speeds. There is a desire for stable frictional properties which change little in friction coefficient with changing temperature.

It is presently known that to incorporate an appropriate amount of metallic fibers into a general friction material is effective in enhancing the strength of the friction material, stabilizing the friction coefficient thereof, maintaining the friction coefficient at high temperatures, improving the efficiency of heat dissipation, improving wear resistance, etc. A friction material produced while directing attention to metallic fibers for such use is disclosed in patent document 1, the friction material containing 5-10% by mass steel fibers, 5-10% by mass copper fibers having an average fiber length of 2-3 mm, and 2-5% by mass zinc powder having a particle diameter of 5-75 μm.

According to patent document 1, the friction material, due to the inclusion of copper fibers in an amount within the given range, can have an improved friction coefficient at low temperatures and can be inhibited from decreasing in friction coefficient at high temperatures during braking at high speeds. These effects are thought to be produced by the following mechanism. During friction between the friction material and the mating material (disk rotor), an adherent coating film is formed on the surface of the mating material because of the spreadability of a metal contained in the friction material and this coating film serves as a protective film. This coating film is thought to greatly contribute to low-temperature stabilization of friction coefficient and high-temperature retention of a high friction coefficient.

Meanwhile, there are cases where wear debris from the disk rotor or a metallic component contained in the friction material of the brake pad bites into the friction material and aggregate there into large metallic masses, which remain between the brake pad and the disk rotor. There are cases where the metallic masses thus formed by aggregation cause abnormal wear to the disk rotor (patent document 2).

At present, most of the metallic components contained in friction materials are metallic fibers mainly including steel fibers and copper fibers. There is a possibility that inclusion of such fibers in a large amount might cause the abnormal wear to the disk rotor.

In addition, since the copper component contained in friction materials is emitted as wear debris upon braking, influences thereof on the natural environment have been pointed out. Patent document 3 hence discloses a method for inhibiting the copper component in a friction material from dissolving away.

PRIOR-ART DOCUMENTS

Patent Documents

Patent Document 1: JP-A-2010-77341
Patent Document 2: JP-A-2007-218395
Patent Document 3: JP-A-2010-285558

SUMMARY OF INVENTION

Problems that the Invention is to Solve

As described above, various friction materials including a friction material containing neither copper fibers nor any metallic component and a friction material in which the metallic component is inhibited from dissolving away have been investigated for the purposes of reducing the abnormal wear of mating materials (disk rotors) and attaining a reduction in environmental burden. However, it has been difficult, with the friction material containing neither copper fibers nor any metallic component, to obtain frictional properties and wear resistance which are equal to those of conventional friction materials containing a copper component, and there has been room for improvements in the performances of the friction material.

Consequently, an object of the invention is to provide a friction material which contains neither any copper component nor metallic fibers and which has stable frictional properties and excellent wear resistance and is less apt to attack mating materials.

Means for Solving the Problems

The present inventors have found that the problems which arise in the case of friction materials containing neither metallic fibers nor any copper component, i.e., a decrease in friction coefficient at high speeds under high load, an increase in attacking against mating materials, and instability of friction coefficient at low temperatures, are overcome, while balancing these properties, by using an abrasive material having a Moh's hardness of 7 or higher, potassium titanate having a plurality of protrudent shapes, and an elastomer-modified phenolic resin in combination in given amounts. The invention has been thus completed. In this description, the expression "not containing any copper component" means that none of copper fibers, copper powders, copper-containing alloys (brass, bronze, etc.), and copper-containing compounds was incorporated as a starting material for the friction material.

Namely, the invention, which eliminates the problems described above, includes the following configurations.
(1) A friction material containing neither metallic fibers nor copper component, the friction material including 10-35% by volume potassium titanate having a plurality of protrudent shapes, 3-10% by volume abrasive material having a Moh's hardness of 7 or higher, and 10-30% by volume elastomer-modified phenolic resin.
(2) The friction material according to (1) above wherein the abrasive material having a Moh's hardness of 7 or higher is at least one selected from the group consisting of stabilized zirconia, zirconium silicate, and alumina.

(3) The friction material according to (1) or (2) above wherein the elastomer-modified phenolic resin is at least one of an acrylic-rubber-modified phenolic resin and a silicone-rubber-modified phenolic resin.

Effects of the Invention

Consequently, according to the invention, a friction material which contains neither metallic fibers nor any copper component and which, despite this, has stable frictional properties and excellent wear resistance and is less apt to attack mating materials can be obtained by using potassium titanate having a specific shape, an elastomer-modified resin, and an abrasive material having a Moh's hardness not less than a given value.

MODES FOR CARRYING OUT THE INVENTION

The abrasive material according to the invention is a friction material containing neither metallic fibers nor any copper component, and is characterized by including 10-35% by volume potassium titanate having a plurality of protrudent shapes, 3-10% by volume abrasive material having a Moh's hardness of 7 or higher, and 10-30% by volume elastomer-modified phenolic resin.

It is preferable that the friction material of the invention should contain a fibrous base material in common use, such as organic fibers or inorganic fibers, and a filler, such as an organic filler or an inorganic filler. The filler is used as a friction modifier together with the abrasive material. It is also preferable that the friction material should contain a binder, e.g., a thermoset resin, which integrates those components, according to need. The friction material according the invention is described below in detail. Herein, "% by weight" has the same meaning as "% by mass".

[Friction Modifiers]

The friction material of the invention contains a filler and an abrasive material as friction modifiers. The filler includes potassium titanate having a plurality of protrudent shapes, which is an inorganic filler, in an amount of 10-35% by volume based on the friction material, and may include other inorganic fillers and organic fillers. The abrasive material includes an abrasive material having a Moh's hardness of 7 or higher in an amount of 3-10% by volume, and may include other abrasive materials.

These ingredients are explained below in detail.

(Potassium Titanate having Plurality of Protrudent Shapes)

The friction material of the invention contains potassium titanate having a plurality of protrudent shapes. This means that the particles of the potassium titanate in the invention have a three-dimensional shape which has a plurality of protrusions.

The expression "having a plurality of protrudent shapes" means that the image of the potassium titanate particle projected on a flat surface can have a shape which has protrusions in two or more directions at least as different from ordinary polygons, circles, ellipses, and the like. Those protrusions are parts corresponding to the portions of a photograph (projected image) taken with an electron microscope which protrude from a polygon, circle, ellipse, or the like (base figure) applied thereto. Examples of the specific three-dimensional shape of the titanic acid compound according to the invention include a boomerang shape, cruciform, amoebiform, parts of various animals or plants (e.g., hands, horns, leaves, etc.) or the whole shapes thereof or analogues of the parts or whole shapes, and shape. The term amoebiform herein means a shape which has a plurality of projections extending in irregular directions.

In particular, due to the plurality of protrudent shapes of the potassium titanate used in the invention, the resin as a binder is mechanically bonded to the potassium titanate according to the invention and, as a result, the potassium titanate according to the invention is apt to be structurally held in the matrix including a fibrous base material and a powdery or particulate friction modifier. It is therefore thought that although containing neither metallic fibers nor any copper component, this friction material retains a high friction coefficient under high-speed high-load conditions and shows wear resistance, since the potassium titanate according to the invention is used therein in combination with an abrasive material having a Moh's hardness of 7 or higher and an elastomer-modified phenolic resin.

In the case where the potassium titanate according to the invention is used as an ingredient for the friction material, it is preferable that the potassium titanate should be potassium hexatitanate ($K_2O.6TiO_2$) or potassium octatitanate ($K_2O.8TiO_2$), because these titanates are less apt to release alkali metal ions, which are causative of deterioration of the resin (binder) that constitutes the matrix of the friction material.

The average particle diameter of the potassium titanate having a plurality of protrudent shapes in the invention is preferably 1-50 μm, more preferably 5-20 μm. Average particle diameter herein can be determined, for example, with a laser diffraction type particle size distribution analyzer.

The potassium titanate having a plurality of protrudent shapes according to the invention is a known inorganic friction modifier, and can be obtained, for example, by the method described in International Publication WO 2008/123046. For example, oxides, salts, etc. of the elements for constituting potassium titanate of an ordinary shape are mixed together using a Henschel mixer and then mixed by means of a vibrating mill while mechanochemically pulverizing the ingredients, thereby obtaining a mixture having high reactivity, and this mixture is burned. Thus, the potassium titanate having the specific shape according to the invention can be produced.

It is preferable that the potassium titanate having a plurality of protrusions according to the invention should be contained in an amount of 10-35% by volume based on the whole friction material, and the content thereof is more preferably 10-20% by volume. By setting a lower limit thereof at 10% by volume or higher, the effects of the invention can be sufficiently obtained. By setting an upper limit thereof at 35% by volume or less, not only a matrix strength required of brake pads can be imparted but also a sufficient compressive deformation amount is obtained and satisfactory vibration properties can be obtained.

(Abrasive Material having Moh's Hardness of 7 or Higher)

An abrasive material having a Moh's hardness of 7 or higher is used in the friction material according to the invention. Use of the abrasive material having a Moh's hardness of 7 or higher is preferred from the standpoint that a high friction coefficient, which is required for high-speed high-load braking, is obtained due to the Moh's hardness thereof.

Examples of the abrasive material having a Moh's hardness of 7 or higher include alumina, silica, silicon carbide, mullite, stabilized zirconia, and zirconium silicate. The abrasive material serves to grind mating materials to improve the friction coefficient.

It is preferable that at least one member selected from the group consisting of stabilized zirconia, zirconium silicate, and alumina, among those abrasive materials, should be used as the abrasive material, from the standpoint that a high friction coefficient, which is required for high-speed high-load braking, is obtained therewith. It is more preferred to use stabilized zirconia and/or zirconium silicate. Those abrasive materials can be used either alone or in combination of two or more thereof.

It is especially preferable that stabilized cubic zirconia, which is thermally stable, should be contained in order to obtain a high friction coefficient, which is required for high-speed high-load braking.

The stabilized zirconia to be used in the invention is prepared, for example, by adding a stabilizer such as calcia (CaO), yttria ($Y_2O_3$), or magnesia (MgO) in an amount of several percents to baddeleyite, which is natural zirconia, and subjecting the mixture to an electromelting/stabilization treatment. Through this treatment, the monoclinic zirconia is converted to cubic zirconia. The zirconia thus comes not to undergo a phase transition and becomes thermally stable.

The degree of stabilization thereof, i.e., the proportion of cubic crystals in the zirconia crystals, is not limited because the degree of stabilization does not affect stabilization of the initial friction coefficient. It is, however, known that in the case of partly stabilized zirconia having a degree of stabilization less than 50%, the disk rotor as a mating material therefor shows a considerably increased wear loss. Namely, such zirconia causes the mating material to show an increased wear loss, depending on the hardness of the mating material. It is hence desirable that the zirconia should have a degree of stabilization of 50% or higher. However, in cases when the wear loss of the mating material is not so large, the degree of stabilization may be less than 50%.

Incidentally, the addition amount of a stabilizer necessary for obtaining 100%-stabilized zirconia which consists only of a solid solution of the stabilizer in a cubic system is, for example, as follows. The following addition amounts are based on the natural zirconia.

Calcia (CaO): 4-8% by mass
Yttria ($Y_2O_3$): 6-10% by mass
Magnesia (MgO): 4-8% by mass It is preferable in the invention that the abrasive material having a Moh's hardness of 7 or higher should be contained in an amount of 3-10% by volume based on the friction material, and the content thereof is more preferably 3-6% by volume. So long as the content thereof is within this range, the friction coefficient during high-speed high-load braking can be improved and attacking against mating materials can be reduced.

It is preferable in the invention that the abrasive material having a Moh's hardness of 7 or higher should have an average particle diameter of 3-20 μm. So long as the average particle diameter thereof is within this range, the friction coefficient during high-speed high-load braking can be improved and attacking against mating materials can be reduced. Incidentally, average particle diameter in the invention is expressed in terms of 50% particle diameter determined by the laser diffraction particle size distribution method.

(Other Friction Modifiers)

As other friction modifiers for use in the invention, organic fillers and inorganic fillers which are in common use can be utilized. An abrasive material having a Moh's hardness less than 7 is also usable.

Examples of the organic fillers include various rubbers including acrylonitrile/butadiene rubbers (NBR), styrene/butadiene rubbers (SBR), and butadiene rubbers(BR), rubber dust, organic dust such as cashew dust, and polytetrafluoroethylene (PTFE).

Example of the inorganic fillers include powders of metals such as aluminum, tin, and zinc, vermiculite, mica, calcium hydroxide, barium sulfate, calcium carbonate, natural graphite, flake graphite, elastic graphite, expanded graphite, tin sulfide, platy, flake, or powdery potassium titanate, lithium potassium titanate, and magnesium potassium titanate. It is, however, noted that the potassium titanate having a plurality of protrudent shapes according to the invention is not included in that potassium titanate.

Examples of the abrasive material having a Moh's hardness less than 7 include magnesia, iron oxide, and chromite.

Those other friction modifiers can be used alone or in combination of two or more thereof, and are used in a powdery or particulate form. The particle diameter, etc. thereof are suitably selected in accordance with the situation under which the friction modifiers are used.

In the invention, friction modifiers including both the potassium titanate having a plurality of protrudent shapes according to the invention and the abrasive material having a Moh's hardness of 7 or higher are used in an amount of usually 30-80% by volume, preferably 60-80% by volume, based on the whole friction material.

[Fibrous Base Material]

Either organic or inorganic fibrous base materials can be used in the invention. However, it is preferable that the friction material should contain neither metallic fibers, e.g., copper fibers, nor any copper component, from the standpoints of being less harmful to the natural environment and of attacking against mating materials.

Examples of the organic fibers include aromatic polyamide (aramid) fibers, cellulose fibers, and polyacrylic fibers.

Examples of the inorganic fibers include potassium titanate fibers, bio-soluble inorganic fibers, glass fibers, carbon fibers, and rock wools.

Each of these fibrous base materials may be used alone, or two or more thereof may be used in combination.

It is preferred in the invention to use, as a fibrous base material, bio-soluble inorganic fibers among inorganic fibrous materials. The bio-soluble inorganic fibers in the invention are inorganic fibers characterized in that the fibers, even when having come into the human body, are decomposed in a short time period and discharged from the body. The term "bio-soluble inorganic fibers" means inorganic fibers that have a chemical composition in which the total content of alkali metal oxides and alkaline earth metal oxides (total content of the oxides of sodium, potassium, calcium, magnesium, and barium) is 18% by mass or higher and that satisfy: the fibers of 20 μm and shorter have a mass half-value period of 10 days or less in a short-term bio-permanence test through respiration; or the fibers of 20 μm and longer have a mass half-value period of 40 days or less in a short-term bio-permanence test through intratracheal injection; or there is no evidence for excessive carcinogenicity in an intraperitoneal test; or the fibers show or cause neither related pathogenicity nor tumorigenesis in a long-term respiration test (EU Directive 97/69/EC, Note Q (exemption from carcinogenic classification)).

Such bio-soluble inorganic fibers preferably are ones which have a chemical composition that includes at least one member selected from $SiO_2$, MgO, and SrO. Specific examples thereof include bio-soluble ceramic fibers such as $SiO_2$—CaO—MgO fibers and $SiO_2$—MgO—SrO fibers and bio-soluble rock wools such as $SiO_2$—CaO—MgO—$Al_2O_3$ fibers.

It is preferable that the ceramic fibers to be used in the invention should be $SiO_2$—MgO—SrO fibers which are bio-soluble ceramic fibers, from the standpoint that these fibers have excellent heat resistance equal to that of alumina-silica fibers and further have excellent bio-solubility and water resistance. These bio-soluble inorganic fibers are produced by forming raw materials for the inorganic fibers into fibers, for example, by a melt spinning method in general use.

As bio-soluble rock wools or bio-soluble ceramic fibers such as $SiO_2$—CaO—MgO fibers, $SiO_2$—CaO—MgO—$Al_2O_3$ fibers, and $SiO_2$—MgO—SrO fibers, use can be made of commercial products such as RB220-Roxul 1000 (manufactured by Lapinus N.V.), Fine Flex E Bulk Fiber T (manufactured by Nichias Corp.), and BIOSTAR Bulk Fiber (manufactured by ITM Co., Ltd.).

It is preferable that the bio-soluble inorganic fibers should have a fiber diameter of 0.1-10 μm and a fiber length of 1-1,000 μm. More preferably, the inorganic fibers have a fiber diameter of 0.2-6 μm and a fiber length of 10-850 μm. So long as the fiber diameter and fiber length thereof are within those ranges, the effects of the invention can be effectively exhibited.

Bio-soluble inorganic fibers usable in the invention generally contain shots (particulate substance) which remained during the production without being formed into fibers. It is preferable that the content of these shots should be 0.1-70% by mass based on the fibrous base material. In case where the content of shots exceeds the upper limit of the range, attacking against the disk rotor is enhanced. Meanwhile, in case where the content of shots is less than the lower limit of that range, the effect of cleaning the disk rotor cannot be expected. It is also possible to separate bio-soluble inorganic fibers from the shots during production and to blend the two in any desired proportion before use.

The bio-soluble inorganic fibers are not particularly limited so long as the fibers satisfy the definition shown above. The bio-soluble inorganic fibers may be ones in which the surface thereof has undergone a surface treatment with a silane coupling agent or the like.

In the invention, a fibrous base material is used in an amount of usually 2-35% by volume, preferably 5-28% by volume, based on the whole friction material.

[Binder]
(Elastomer-Modified Phenolic Resin)

The friction material according to the invention contains an elastomer-modified phenolic resin. The elastomer to be used for modifying a phenolic resin may be any elastomer which gives plasticity to the phenolic resin, and examples thereof include crosslinked natural rubber and synthetic rubbers.

It is preferred to use an acrylic rubber, silicone rubber, or the like as the elastomer for modifying a phenolic resin. One elastomer-modified phenolic resin can be used alone, or two or more elastomer-modified phenolic resins can be used in combination.

It is preferable that the elastomer-modified phenolic resin according to the invention should be contained in an amount of 10-30% by volume based on the whole friction material, and the content thereof is more preferably 10-20% by volume. So long as the content thereof is in the amount of 10-30% by volume, it is possible to attain a stabilized low-temperature friction coefficient even in the absence of an adherent coating film derived from a metallic component.

Examples of binders usable in the invention include thermosetting resins such as phenolic resins (including straight phenolic resins and various modified phenolic resins), melamine resins, epoxy resins, and polyimide resins, besides the elastomer-modified phenolic resin. The various modified phenolic resins include hydrocarbon-resin-modified phenolic resins, epoxy-modified phenolic resins, and the like.

In the invention, a binder including the elastomer-modified phenolic resin is used in an amount of usually 10-30% by volume, preferably 14-20% by volume, based on the whole friction material.

[Production of the Friction Material]

The friction material of the invention can be produced by mixing the ingredients shown above and subjecting the mixture to preforming and then to treatments such as thermoforming, heating, and grinding in accordance with an ordinary production process.

A brake pad equipped with the friction material can be produced through the following steps (1) to (4).

(1) Step in which a steel plate (pressure plate) is formed into a given shape with a sheet metal press.
(2) Step in which the steel plate formed into a given shape is subjected to a degreasing treatment, chemical treatment, and primer treatment, and an adhesive is applied thereto.
(3) Step in which the pressure plate which has undergone steps (1) and (2) above and a preform for the friction material are thermoformed in a thermoforming step at a given temperature and pressure to integrally bond the two members to each other.
(4) Step in which postcure is thereafter performed, and the resultant product is finally subjected to finish processing such as grinding, surface burning, and coating.

EXAMPLES

The invention will be explained below in detail by reference to Examples. However, the invention should not be construed as being limited to the following Examples.

Examples 1 to 11 and Comparative Examples 1 to 6

Ingredients for a friction material were evenly mixed by means of a mixer in accordance with each recipe (% by volume) shown in Table 1, thereby obtaining a friction material mixture. Subsequently, the friction material mixture was preformed at room temperature and a pressure of 6 MPa, thereafter press-formed for 5 minutes with heating at a temperature of 140-170° C. and an areal pressure of 30-80 MPa, and then heat-treated for 1-4 hours at a temperature of 150-300° C. and a clamping force of 980-7,840 N. Thus, friction materials A to Q were obtained.

The potassium titanate used as a filler was potassium titanate having a plurality of protrudent shapes and had an average particle diameter of 10 μm (TERRACESS JP, manufactured by Otsuka Chemical Co., Ltd.).

As organic fibers were used aramid fibers. As inorganic fibers, use was made of bio-soluble $SiO_2$—MgO—SrO ceramic fibers having a shot content of 30% by mass (Biostar 600/70, manufactured by ITM Co. Ltd.).

The Moh's hardness values of the abrasive materials used in the invention are as follows: the Moh's hardness of stabilized zirconia and zirconium silicate is 7; that of alumina is 9; and that of the iron oxide ($Fe_3O_4$) used in Comparative Example 6 (friction material Q) is 6.

The methods used for evaluating the friction materials A to Q obtained are shown below.

(1) Frictional Property

Frictional property evaluation according to JASO C406 (general performance test) was conducted. A low-temperature effectiveness test (test conditions: initial speed of braking, 50 km/h; braking deceleration, 2.94 m/s$^2$; brake temperature before braking, 50° C.) was performed for evaluating low-temperature frictional properties, and a friction coefficient μ was determined. Furthermore, a second effectiveness test (test conditions: initial speed of braking, 130 km/h; braking deceleration, 7.35 m/s$^2$) was performed for evaluating high-speed high-load frictional properties, and a friction coefficient μ was determined.

In general, higher values of friction coefficient μ tend to be preferred. However, since too high values of friction coefficient μ in the low-temperature effectiveness test are prone to cause a brake noise, preferred values are within 0.30±10%, i.e., 0.27-0.33. Meanwhile, in the second effectiveness test, the higher the friction coefficient μ, the more the friction material is preferred. However, a balance between the friction coefficient μ and attacking against mating materials is taken into account to suitably regulate the friction coefficient to a desired value.

(2) Wear Resistance

Evaluation according to JASO C427 (abrasion test at different temperatures) was conducted to evaluate the brake pad (friction material) for wear loss under conditions corresponding to a brake temperature of 300° C. and the number of braking operations of 1,000. It is preferred that value of pad wear loss, which indicates wear resistance, is smaller.

(3) Attacking against Mating Material

Frictional property evaluation according to JASO C406: 2000 (dynamometer test method) was conducted, and the wear loss of the disk rotor (mating material) was evaluated thereafter. The disk rotor used was one corresponding to FC200.

The results of the evaluation (1) to (3) above are shown in Table 1 together with the recipe of each friction material.

TABLE 1

(vol. %)

| Friction material | | Ex. 1 A | Ex. 2 B | Ex. 3 C | Ex. 4 D | Ex. 5 E | Ex. 6 F | Ex. 7 G | Ex. 8 H | Ex. 9 I | Ex. 10 J | Ex. 11 K | Comp. Ex. 1 L | Comp. Ex. 2 M | Comp. Ex. 3 N | Comp. Ex. 4 O | Comp. Ex. 5 P | Comp. Ex. 6 Q |
|---|---|---|---|---|---|---|---|---|---|---|---|---|---|---|---|---|---|---|
| Recipe | Binder | | | | | | | | | | | | | | | | | |
| | Straight phenolic resin | 0 | 0 | 0 | 0 | 0 | 0 | 0 | 10 | 0 | 0 | 0 | 20 | 20 | 20 | 20 | 0 | 0 |
| | Acrylic-rubber-modified phenolic resin | 20 | 20 | 20 | 20 | 20 | 20 | 0 | 10 | 20 | 15 | 20 | 0 | 0 | 0 | 0 | 20 | 20 |
| | Silicone-rubber-modified phenolic resin | 0 | 0 | 0 | 0 | 0 | 0 | 20 | 0 | 0 | 15 | 0 | 0 | 0 | 0 | 0 | 0 | 0 |
| Friction modifier | Filler | | | | | | | | | | | | | | | | | |
| | Cashew dust | 7 | 7 | 7 | 7 | 7 | 7 | 7 | 7 | 7 | 7 | 7 | 7 | 7 | 7 | 7 | 7 | 7 |
| | Barium sulfate | 37 | 32 | 27 | 12 | 30 | 27 | 23 | 27 | 27 | 17 | 40 | 27 | 32 | 37 | 41 | 37 | 37 |
| | Mica | 2 | 2 | 2 | 2 | 2 | 2 | 2 | 2 | 2 | 2 | 2 | 2 | 2 | 2 | 2 | 2 | 2 |
| | Graphite | 10 | 10 | 10 | 10 | 10 | 10 | 10 | 10 | 10 | 10 | 10 | 10 | 10 | 10 | 10 | 10 | 10 |
| | Potassium titanate (*) | 10 | 15 | 20 | 35 | 0 | 0 | 0 | 0 | 0 | 20 | 0 | 10 | 10 | 10 | 10 | 0 | 10 |
| | Platy potassium titanate | 0 | 0 | 0 | 0 | 0 | 0 | 0 | 0 | 0 | 0 | 0 | 0 | 0 | 0 | 0 | 10 | 0 |
| | Zinc | 1 | 1 | 1 | 1 | 1 | 1 | 1 | 1 | 1 | 1 | 1 | 1 | 1 | 1 | 1 | 1 | 1 |
| | Abrasive material | | | | | | | | | | | | | | | | | |
| | Stabilized zirconia | 2 | 2 | 2 | 2 | 1 | 2 | 3 | 2 | 2 | 2 | 0 | 2 | 2 | 2 | 1 | 2 | 2 |
| | Zirconium silicate | 4 | 4 | 4 | 4 | 2 | 4 | 7 | 4 | 4 | 4 | 0 | 4 | 4 | 4 | 1 | 4 | 0 |
| | Alumina | 0 | 0 | 0 | 0 | 0 | 0 | 0 | 0 | 0 | 0 | 3 | 0 | 0 | 0 | 0 | 0 | 0 |
| | Iron oxide | 0 | 0 | 0 | 0 | 0 | 0 | 0 | 0 | 0 | 0 | 0 | 0 | 0 | 0 | 0 | 0 | 6 |
| Fibrous base material | Metallic fibers | | | | | | | | | | | | | | | | | |
| | Copper fibers | 0 | 0 | 0 | 0 | 0 | 0 | 0 | 0 | 0 | 0 | 0 | 0 | 0 | 0 | 0 | 0 | 0 |
| | Steel fibers | 0 | 0 | 0 | 0 | 0 | 0 | 0 | 0 | 0 | 0 | 0 | 5 | 5 | 0 | 0 | 0 | 0 |
| | Organic fibers | | | | | | | | | | | | | | | | | |
| | Aramid fibers | 5 | 5 | 5 | 5 | 5 | 5 | 5 | 5 | 5 | 5 | 5 | 5 | 5 | 5 | 5 | 5 | 5 |
| | Inorganic fibers | | | | | | | | | | | | | | | | | |
| | Biosoluble ceramic fibers | 2 | 2 | 2 | 2 | 2 | 2 | 2 | 2 | 2 | 2 | 2 | 2 | 2 | 2 | 2 | 2 | 2 |
| Evaluation | Frictional property | | | | | | | | | | | | | | | | | |
| | Low-temperature effectiveness test (50° C., 50 km/h, 2.94 m/s²) | 0.30 | 0.30 | 0.31 | 0.31 | 0.29 | 0.30 | 0.31 | 0.30 | 0.30 | 0.28 | 0.33 | 0.35 | 0.30 | 0.37 | 0.35 | 0.39 | 0.36 |
| | Second effectiveness test (130 km/h, 7.35 m/s²) | 0.35 | 0.35 | 0.37 | 0.38 | 0.36 | 0.38 | 0.39 | 0.36 | 0.35 | 0.34 | 0.38 | 0.41 | 0.38 | 0.38 | 0.33 | 0.33 | 0.34 |
| | Wear resistance | | | | | | | | | | | | | | | | | |
| | Pad wear loss (mm) | 0.24 | 0.24 | 0.22 | 0.21 | 0.20 | 0.22 | 0.23 | 0.22 | 0.23 | 0.24 | 0.35 | 0.40 | 0.23 | 0.35 | 0.20 | 0.37 | 0.40 |
| | Attacking against mating material | | | | | | | | | | | | | | | | | |
| | Rotor wear loss (μm) | 14.0 | 14.0 | 14.5 | 14.5 | 13.5 | 14.5 | 15.0 | 14.0 | 14.0 | 13.5 | 15.0 | 28.5 | 15.0 | 22.0 | 11.0 | 24.0 | 23.0 |

(*) Potassium titanate having a plurality of protrudent shapes

Friction material M of Comparative Example 2 contains copper fibers and a straight phenolic resin, and the recipe thereof corresponds to a recipe conventionally in general use for NAO (non-asbestos organic) friction materials. Friction materials A to K according to the invention (Examples 1 to 11) showed high performance equal to that of friction material M in each of frictional property, wear resistance, and attacking against mating materials.

The friction material in which the content of metallic fibers had been increased as compared with friction material M, as a reference, showed an increased pad wear loss and hence low wear resistance and had an increased value of attacking against mating materials. In addition, this friction material had an increased friction coefficient in the low-temperature effectiveness test, and has the possibility of causing a brake noise (Comparative Example 1, friction material L).

Meanwhile, friction material N (Comparative Example 3), which contained no metallic fibers in contrast to friction material M, showed a larger value of friction coefficient in the low-temperature effectiveness test than friction materials L and M, which contained metallic fibers. Furthermore, this friction material still showed a high value of rotor wear loss, which indicates attacking against mating materials. Although reducing the abrasive-material amount used in friction material N results in an improvement in wear resistance, the effectiveness under high load is low (Comparative Example 4, friction material O). Moreover, the friction coefficient of friction material O in the low-temperature effectiveness test is still high, and this friction material has the possibility of causing a brake noise.

In contrast, by replacing the straight phenolic resin as the binder with an acrylic-rubber-modified phenolic resin, friction material A showing stable frictional properties was obtained in which the friction coefficient in the low-temperature effectiveness test was not too high although this friction material contained neither any copper component nor metallic fibers (Example 1).

It was found that friction materials having performances equal to those of the conventional friction material M serving as a reference are obtained as friction materials containing neither any copper component nor metallic fibers by using, as the binder, not the straight phenolic resin but an elastomer-modified phenolic resin such as an acrylic-rubber-modified phenolic resin or a silicone-rubber-modified phenolic resin. However, even when the binder only is changed, it is impossible to obtain stable frictional properties, excellent wear resistance, and mitigated attacking against mating materials (Comparative Example 5, friction material P; and Comparative Example 6, friction material Q).

A comparison between friction material A of Example 1 and friction material P of Comparative Example 5 shows that use of potassium titanate having a plurality of protrudent shapes in place of the platy potassium titanate included in the filler makes it possible to obtain a friction material which is excellent in terms of frictional property and wear resistance and reduced in attacking against mating materials.

It can also be seen from a comparison between friction material A of Example 1 and friction material Q of Comparative Example 6 that in cases when an abrasive material having a Moh's hardness less than 7 (iron oxide: $Fe_3O_4$) is used as the only abrasive material, not only stable frictional properties are not obtained but also the wear resistance and the property of attacking mating materials are unsatisfactory. It was understood that it is necessary to use an abrasive material which includes one or more of materials having a Moh's hardness of 7 or higher, such as stabilized zirconia, zirconium silicate, and alumina.

Consequently, a friction material which has stable frictional properties and is less apt to attack mating materials can be obtained so long as the friction material is one according to the invention, which contains neither metallic fibers nor any copper component and includes 10-35% by volume potassium titanate having a plurality of protrudent shapes, 3-10% by volume abrasive material having a Moh's hardness of 7 or higher, and 10-30% by volume elastomer-modified phenolic resin.

While the invention has been described in detail and with reference to specific embodiments thereof, it will be apparent to one skilled in the art that various changes and modifications can be made therein without departing from the spirit and scope thereof. This application is based on a Japanese patent application filed on Dec. 21, 2012 (Application No. 2012-280239), the contents thereof being incorporated herein by reference.

INDUSTRIAL APPLICABILITY

The friction material according to the invention imposes little burden on the environment since this friction material contains neither any copper component nor metallic fibers. In addition, since this friction material includes the potassium titanate having a specific shape, an abrasive material, and an elastomer-modified phenolic resin in respective specific amounts, this friction material has stable frictional properties, excellent wear resistance, and a reduced tendency to attack mating materials, these properties being equal or superior to those of conventional friction materials, although neither any copper component nor metallic fibers are contained therein. Consequently, application of the friction material according to the invention to brake pads, brake linings, clutches, and the like for use in motor vehicles, railroad cars, industrial machines, etc. is especially useful, and this friction material has an exceedingly high technical significance.

The invention claimed is:

1. A friction material for a brake pad of a disk brake, comprising:
   potassium titanate having a plurality of protrudent shapes in an amount of 10-20% by volume of the friction material;
   an abrasive material having a Moh's hardness of 7 or higher in an amount of 6-10% by volume of the friction material, wherein the abrasive material having a Moh's hardness of 7 or higher includes stabilized zirconia and zirconium silicate; and
   an elastomer-modified phenolic resin in an amount of 20-30% by volume of the friction material, wherein the elastomer-modified phenolic resin includes silicone-rubber-modified phenolic resin in an amount of 15-20% by volume of the friction material,
   wherein the friction material contains neither metallic fibers nor copper component, and
   wherein the friction material does not contain glass fibers.

2. The friction material according to claim 1, wherein the abrasive material having a Moh's hardness of 7 or higher includes the stabilized zirconia in an amount of 1-3% by volume of the friction material, and the zirconium silicate in an amount of 2-7% by volume of the friction material.

3. The friction material according to claim 1, wherein the friction material further includes cashew dust, mica, graphite, zinc, aramid fibers, and bio-soluble ceramic fibers.

4. The friction material according to claim 1, wherein the elastomer-modified phenolic resin further includes acrylic-rubber-modified phenolic resin.

5. The friction material according to claim 4, wherein the acrylic-rubber-modified phenolic resin is in an amount of 5 15% by volume of the friction material.

* * * * *